United States Patent [19]
Ozguc

[11] Patent Number: 6,130,541
[45] Date of Patent: Oct. 10, 2000

[54] ADAPTIVE DRIVER WITH CAPACITIVE LOAD SENSING AND METHOD OF OPERATION

[75] Inventor: Ismail H. Ozguc, Sunnyvale, Calif.

[73] Assignee: International Microcircuits Inc., Milpitas, Calif.

[21] Appl. No.: 09/097,605

[22] Filed: Jun. 15, 1998

Related U.S. Application Data

[60] Provisional application No. 60/061,696, Oct. 10, 1997, and provisional application No. 60/063,472, Oct. 10, 1997.

[51] Int. Cl.$^7$ .............. G01R 27/26; G05F 3/16; H03K 19/0175; H03K 5/12; H03B 1/00
[52] U.S. Cl. .......... 324/678; 324/681; 327/108; 327/170; 326/62; 326/87; 323/315
[58] Field of Search .................. 323/315, 316, 323/62, 312, 313; 326/80, 82, 86, 87; 327/108, 111, 112, 170; 324/678, 681, 667, 674, 672, 679

[56] References Cited

U.S. PATENT DOCUMENTS

| | | | |
|---|---|---|---|
| 3,624,494 | 11/1971 | Turan | 324/653 |
| 4,424,456 | 1/1984 | Shiraki et al. | 327/111 |
| 4,553,082 | 11/1985 | Nesler | 327/111 |
| 4,829,199 | 5/1989 | Prater | 326/27 |
| 4,873,673 | 10/1989 | Hori et al. | 327/111 |
| 5,672,993 | 9/1997 | Runaldue | 327/404 |
| 5,696,464 | 12/1997 | Bartlett | 327/538 |
| 5,801,564 | 9/1998 | Gasparik | 327/170 |
| 5,877,634 | 3/1999 | Hunley | 326/83 |
| 5,886,554 | 3/1999 | Corsi et al. | 327/170 |
| 6,037,811 | 3/2000 | Ozguc | 327/108 |

*Primary Examiner*—Safet Metjahic
*Assistant Examiner*—Jermele M. Hollington
*Attorney, Agent, or Firm*—Townsend and Townsend and Crew LLP

[57] ABSTRACT

An adaptive output driver includes circuitry for sensing the capacitive loading of a driver circuit and then adjusting the drive output so that the output signal possess a desired slew rate. In one embodiment, the circuit of the present invention includes a capacitance sensor, a control circuit, and an output driver. The capacitance sensor measures the unknown load capacitance. The control circuit generates a control signal in response to the capacitive load measurement. The output driver receives the control signal and in response produces an output level which when supplied to the capacitive load produces an output signal having the desired slew rate.

23 Claims, 3 Drawing Sheets

ADAPTIVE DRIVER WITH CAPACITIVE LOAD SENSING AND METHOD OF OPERATION

CROSS-REFERENCE TO RELATED APPLICATIONS

This application claims priority from the following U.S. Provisional Applications, the disclosure of which are incorporated by reference in their entirety for all purposes:

Application No. 60/061,696, filed Oct. 10, 1997, of Ismail H. Ozguc, entitled "ADAPTIVE DRIVER WITH CAPACITIVE LOAD SENSING"; and Application No. 60/063,472, filed Oct. 10, 1997, of Ismail H. Ozguc, entitled "CURRENT CONTROLLED OUTPUT BUFFER".

BACKGROUND OF THE INVENTION

The present invention relates in general to integrated circuits, and in particular to an adaptive driver circuit capable of sensing the amount of capacitive load at its output and adjusts its output drive level to produce a desired output signal slew rate.

In certain applications, an electronic system may require an integrated circuit (IC) to drive other circuitry that present variable capacitive load conditions. For example, in a computer system, a clock driver IC would have to drive varying capacitive loads depending on the size of the memory system implemented. When adding memory to a PC, for example, the same IC must drive a larger capacitive load.

As is known in the art, the slew rate of the driver's output signal is dependent upon its output drive (current) supplied to the capacitive load and the value of the capacitive load, as shown in equation 1:

$$\text{Slew rate} = \Delta V_c / \Delta t = I/C \quad (1)$$

where $V_c$ = the capacitive load voltage t = the rise/fall time

I = the current delivered to the capacitive load

C = the value of the capacitive load

Thus, it can be seen that for small load capacitances and/or large driver currents, the slew rate will be correspondingly higher than for large load capacitances and/or small supplied currents.

In order to accommodate variable capacitive loading conditions as described above, conventional driver circuits typically supply a fixed amount of current assuming the largest capacitive load. The fixed current is that which will drive the largest anticipated capacitive load and still meet the desired slew rate. However, in circumstances in which the capacitive load is smaller, the slew rate will be faster than desired.

A faster than desired slew rate is disadvantageous since the driver can generate a greater number of high frequency harmonics. High frequency harmonics can give rise to electromagnetic interference (EMI), which in some instances may exceed the maximum tolerable EMI specifications. Furthermore, the fixed output drive level will generate output signals having varying slew rates as different memory configurations having different load capacitances are installed. The varying clock slew requires slew rate adjustment circuitry which adds to circuit complexity and cost. Lastly, the conventional driver circuit does not possess the capability of providing slew rate adjustability. It is often desirable to alter the slew rate of the input drive signal to correct for effects caused by preceding circuitry.

What is needed is a driver circuit which is capable of varying its output drive level so that the output signal slew rate can be adjusted as desired.

SUMMARY OF THE INVENTION

The present invention provides methods and circuitry for sensing the capacitive loading of a driver circuit and then adjusting the output drive level accordingly to provide a output slew rate. In one embodiment, the circuit of the present invention includes a capacitance sensor, a control circuit, and an output driver. The capacitance sensor measures the load capacitance. The control circuit generates a control signal in response to the capacitive load measurement. The output driver receives the control signal and in response causes the output drive level of the output driver to increase or decrease so that an output signal having the desired slew rate is obtained.

The driver's output level can be controlled such that the output slew rate remains substantially the same over varying load capacitances. In this configuration, the new driver offers the advantage of providing a more uniform output slew rate, averting the need for slew rate correction circuitry. In addition, the new driver consumes less power than the conventional driver circuit since it generates and supplies only the minimal drive level needed to produce the desired slew rate. Alternatively, the output slew rate may also be adjusted (by controlling the output level) up or down to correct for any effects caused by the preceding circuitry.

A better understanding of the nature of the invention and advantages of the adaptive driver of the present invention may be gained by referring to the following detailed description and drawings below.

DESCRIPTION OF THE PREFERRED EMBODIMENT

Figure 1:
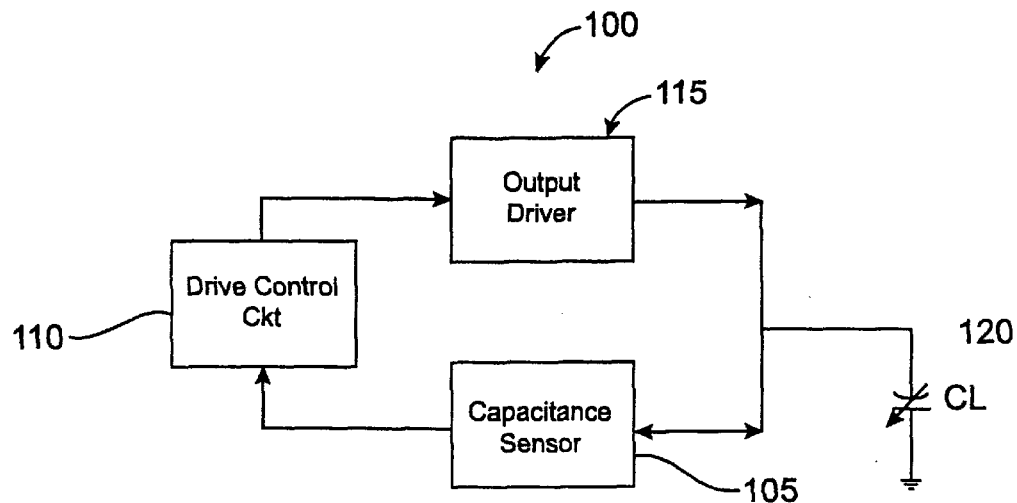
FIG. 1 illustrates a simplified block diagram of the adaptive driver circuit in accordance with the present invention.

FIG. 1 shows a simplified block diagram of an adaptive output driver in accordance with the present invention. The adaptive driver 100 includes a capacitance sensor 105, a control circuit 110, and a driver circuit 115. The capacitance sensor 105 and the output driver 115 are coupled to an unknown capacitive load 120.

Figure 2:
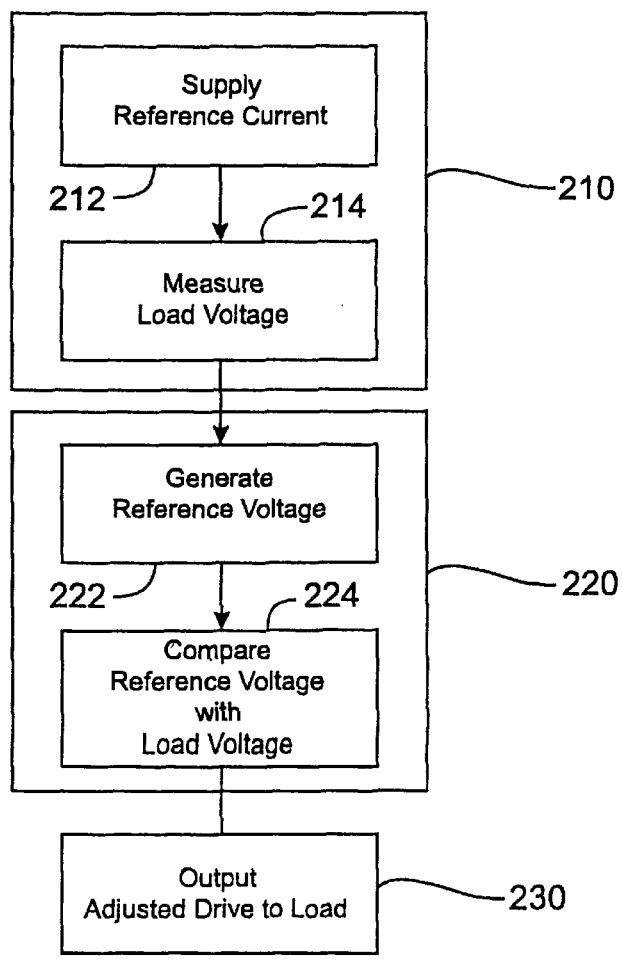
FIG. 2 is a flow chart describing the method of operation of the adaptive driver circuit shown in FIG. 1.

FIG. 2 shows a flow chart describing the adaptive output driver's 100 method of operation. Initially at step 210, the capacitance sensor measures the amount of capacitance $C_L$ 120 which is present at the load. In the preferred embodiment, this is accomplished by first supplying a reference current to the capacitive load for a predefined time period (step 212) and then measuring the voltage attributable to the supplied reference current at the end of the predefined period (step 214). Subsequently at step 220, a control signal is generated in response to the measured load capacitance. In the preferred embodiment, control signal generation is accomplished by generating a reference voltage level (step 222) and comparing the reference voltage level with the load voltage level attributable to the supplied reference current (step 224). Finally at step 230, the control signal is communicated to the driver circuit for increasing or decreasing the amount of current supplied to the capacitive load. In this manner, the driver circuit supplies an appropriate amount of current to the unknown capacitive load so that the slew rate of the output drive signal is produced as desired.

Figure 3:
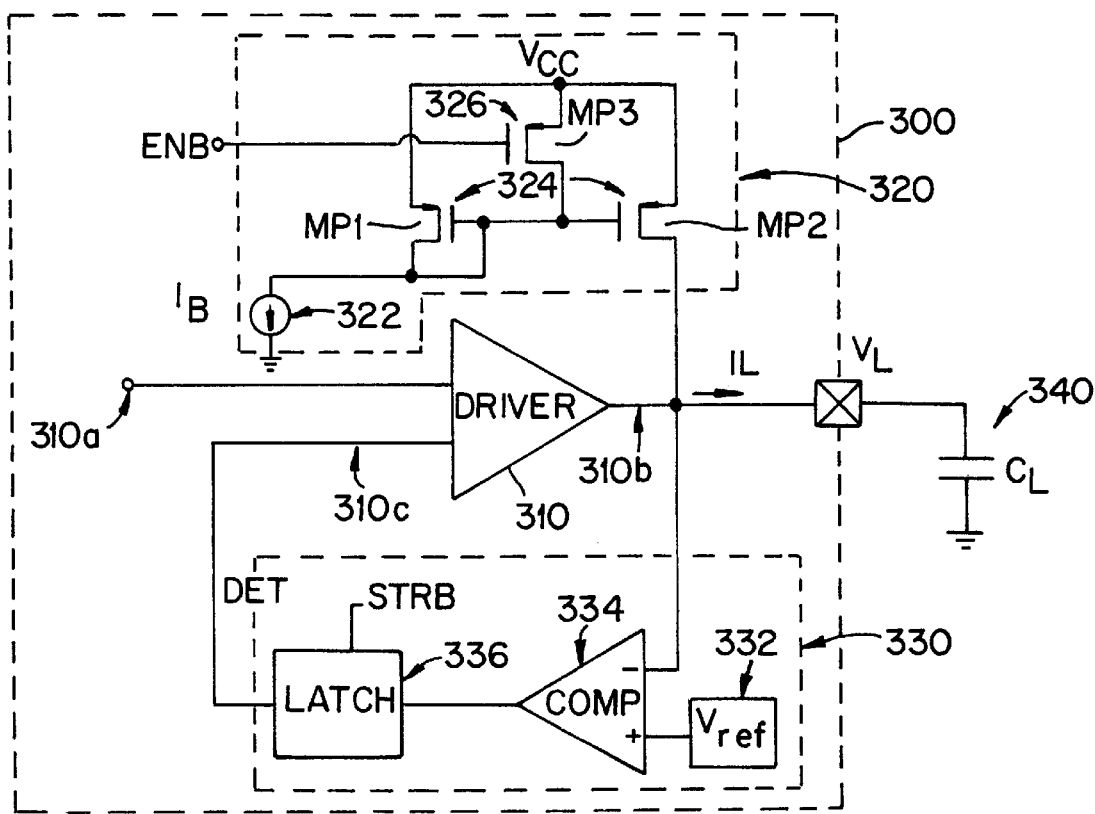
FIG. 3 illustrates a first embodiment of the adaptive driver circuit shown in FIG. 1.

FIG. 3 illustrates a detailed schematic of the adaptive output driver in a first embodiment. In this embodiment, the adaptive driver 300 includes a driver circuit 310, a charging circuit 320, and a control circuit 330. The driver circuit 310 includes an input terminal 310a for receiving the input signal, an output terminal 310b for transmitting a subsequently produced output signal, and a control terminal 310c for receiving a driver control signal, described below. The driver circuit 310 may be any variable output driver circuit, the preferred embodiment of which is described in the commonly-assigned co-pending patent application number 60/063,472 (Atty Docket No. 17669-2), entitled "Current-Controlled Output Buffer," filed Oct. 10, 1997, which is hereby incorporated by reference in its entirety.

The charging circuit 320 includes a current source 322, a current mirror 324, and an enabling circuit 326. In the preferred embodiment of FIG. 3, the current mirror 324 consists of two FET transistors MP1 and MP2 and the enabling circuit 326 is a FET device MP3 coupled between $V_{cc}$ and the common gate terminal of the current mirror transistors MP1 and MP2. Alternatively, the current mirror and enabling circuitry may be devices of any transistor type and include multiple transistors of the same or varying gate peripheries.

During operation, the charging circuit 320 supplies a known load current $I_L$ to an unknown capacitive load 340. The load current $I_L$ is produced by mirroring the bias current $I_B$ using transistors MP1 and MP2. Transistor MP3 is turned off and $I_L$ is allowed to charge $C_L$ 340 up for a maximum fixed duration of time $T_{chg}$ as governed by an enable signal ENB, shown in FIG. 4A. During the time period $T_{chg}$, a load voltage $V_L$ (FIG. 4B) develops across the unknown capacitive load 340, increasing at a rate of $I_L$ divided by $C_L$. Thus, $V_L$ will increase slower for larger capacitive loads and faster for smaller capacitive loads.

Figure 4:
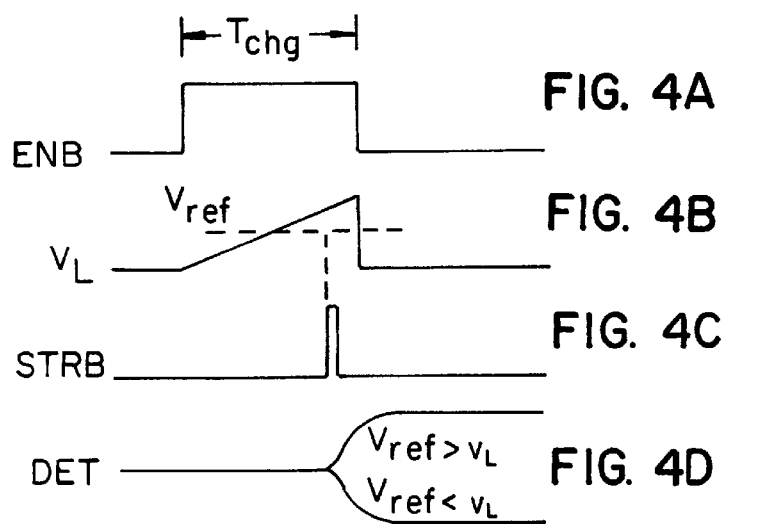
FIGS. 4A–4D are timing diagrams showing the operation of the adaptive driver circuit of FIG. 3.

The control circuit 330 monitors the load voltage $V_L$ developed across $C_L$ in response to the supply of $I_L$. In addition, a reference voltage $V_{ref}$ is produced by a reference generator 332. The reference voltage $V_{ref}$ and the load voltage $V_L$ are supplied to complementary inputs of a comparator 334. The comparator 334 compares the voltage levels of $V_L$ and $V_{ref}$, and in response generates a high (low) signal when the non-inverting (or inverting) input is larger in magnitude. In FIG. 3, $V_L$ is sampled at the inverting input. Thus, when $V_L$ surpasses $V_{ref}$ as shown in FIG. 4B, the comparator 334 outputs a low signal.

The comparator's output signal is received by a latch circuit 336. A strobe signal STRB (FIG. 4C) activates the latch circuit 336 to sample the comparator's output signal and transmit it to the control terminal 310c of the driver circuit 310. The latch circuit 336 outputs the DET control signal when strobed, as shown in FIG. 4D. The DET control signal is subsequently fed into the control terminal 310c of the driver circuit 310 to vary the output of the driver 310 higher (or lower) if the detected capacitive load 340 is larger (or smaller) than the threshold load capacitance.

The STRB signal can be timed to activate the latch circuit 336 at an earlier or later time during the $T_{chg}$ period, resulting in a shorter or longer charging period, and accordingly a lower or higher $V_L$ value. In addition, the magnitude of reference current $I_L$ supplied and the maximum time period over which the unknown load capacitance is allowed to charge ($T_{chg}$) may be varied up or down to accommodate larger or smaller anticipated capacitive loads $C_L$ 340.

In the above embodiment, while the charging duration can be made accurate by generating a STRB signal using, for example, a crystal oscillator, the amount of current $I_L$ may not be as accurate. The load current $I_L$ depends on the bias current $I_B$ whose value is typically dependent on power supply, temperature and process variations. In a typical CMOS process, the variation in the magnitude of $I_B$ and thus variations in the final detected value for $C_L$ may be as high as ±20% to 25%. The accuracy of this circuit can be improved somewhat by well-known trimming techniques.

Figure 5:
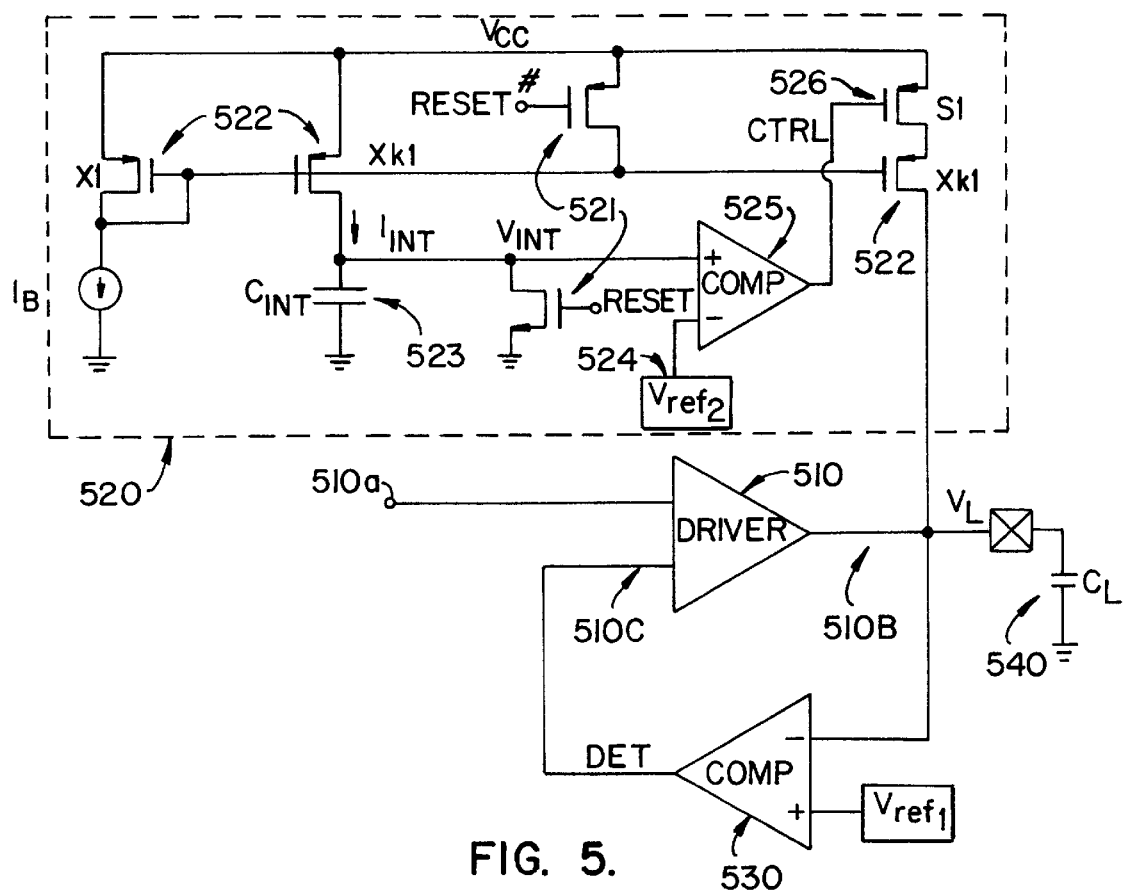
FIG. 5 illustrates a second embodiment of the adaptive driver circuit shown in FIG. 1.

FIG. 5 illustrates an alternative embodiment of the present invention where, instead of making the charging duration a fixed period, the charging duration is made proportional to the bias current $I_B$. In this embodiment, the charging circuit 520 replicates its corresponding functions described in the first embodiment. The charging circuit 520 includes reset circuitry 521, a current mirror 522, an internal capacitor 523, a reference generator 524, a voltage comparator 525 and a switch transistor 526.

When the RESET transistors are released, $I_B$ is mirrored as $I_{INT}$ charging internal capacitor $C_{INT}$ 523. The current $I_B$ is also mirrored as $I_L$ to charge the unknown capacitive load $C_L$ 540. The mirroring ratios can be adjusted such that $I_{INT}=I_L=k1*I_B$, wherein k1 is a multiplier representing the device size ratio between the 522 transistors. The internal capacitor $C_{INT}$ 523 may be realized as a lumped element capacitor or as transistor parasitic capacitance.

As the internal capacitor $C_{INT}$ 523 integrates the current $I_{INT}$, the voltage $V_{INT}$ across $C_{INT}$ 521 rises linearly. Concurrently, a reference generator 524 produces a voltage $V_{ref2}$. Voltages $V_{ref2}$ and $V_{INT}$ are supplied to complementary inputs of a voltage comparator 525. When $V_{INT}$ reaches $V_{ref2}$, the comparator 525 outputs a low signal, which turns a switch transistor S1 off. This switches off the load current $I_L$, which stops the load voltage $V_L$ from increasing. The control signal CTRL which sets the charging duration for $C_L$ 540, is thus made to vary with the variation in the amount of bias current $I_B$. As a result, the capacitance detection circuit operates with much improved accuracy over process variations.

Figure 6:
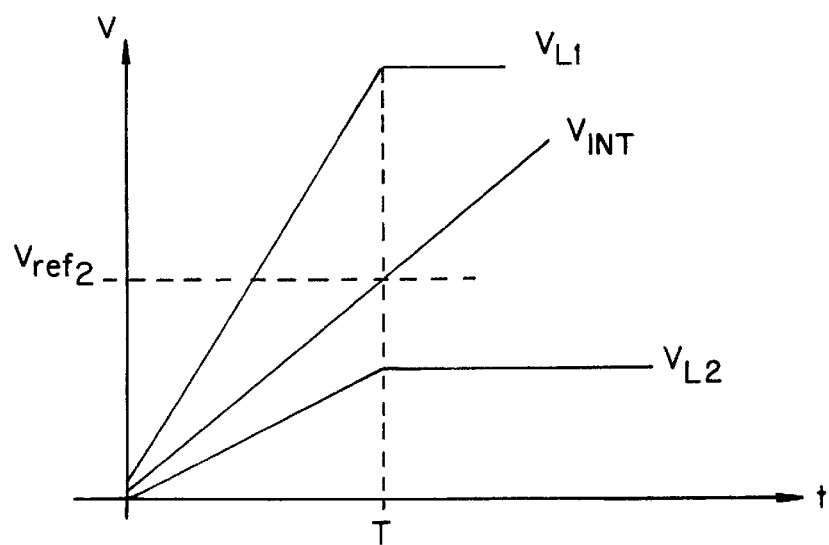
FIG. 6 is a timing diagram illustrating the operation of the adaptive driver circuit of FIG. 5.

FIG. 6 shows a graph of voltages $V_{ref2}$, $V_{INT}$, and $V_L$ versus time. The voltage $V_{ref2}$ remains constant over time, while $V_{INT}$ increases linearly depending upon the size of $C_{INT}$ and the magnitude of $I_{INT}$ ($I_B$). At time T, $V_{INT}$ reaches $V_{ref2}$ and the comparator produces a high output (since $V_{INT}$ is coupled to the non-inverting input), turning switch transistor S1 off, and terminating the charging period. Graph lines $V_{L1}$ and $V_{L2}$ illustrate two respective load voltages at the cutoff time T, $V_{L1}$ representing a smaller capacitive load $C_{L1}$ and $V_{L2}$ corresponding to a larger capacitive load $C_{L2}$. After time T, the load voltages do not change since the output of comparator 525 remains high, turning off the supplied current $I_L$.

The driver and the control circuits 510 and 530 essentially replicate their corresponding functions described in the first embodiment. The control circuit 530 (a voltage comparator) senses the load voltage $V_{L1}$ or $V_{L2}$ at an inverting comparator input and a reference voltage $V_{ref1}$ at a non-inverting port. In response, the comparator 530 supplies a control signal to the driver circuit 510, as described above. In the case where $V_{L1}$ is the sensed load voltage, the comparator 530 outputs a low signal to reduce the drive current, and visa versa for the case in which $V_{L2}$ is sensed. No latch circuit is needed since the charging duration is controlled in the charging circuit 520 by the control signal CTRL.

While the above description is complete with regards to the preferred embodiments of the invention, other variations, modifications and equivalents will be evident to those skilled in the art. For example, in the exemplary embodiments described the control circuits compare the output voltage $V_L$ to a single $V_{ref}$ level to decide between a large or small capacitive load. Other embodiments are possible wherein the control circuit includes multiple comparators comparing $V_L$ to multiple reference voltages. Comparison of $V_L$ to multiple reference levels increases the resolution of the circuit and allows for a further fine tuning of the drive capability of the adaptive driver circuit. Therefore, the above description is not intended to define the complete scope of the invention, which is appropriately defined by the following claims.

What is claimed is:

1. An adaptive driver circuit comprising:
    an output driver circuit having a first input terminal configured to receive an input signal, an output terminal coupled to a capacitive load, and a second input terminal configured to receive a control signal;
    a charging circuit coupled to said output terminal configured to supply a reference current thereto; and
    a control circuit coupled to said output terminal and to said output driver circuit, being configured to sense a capacitive load voltage signal developed across said capacitive load in response to said supplied reference current, said control circuit generating said control signal in response to said sensed capacitive load voltage signal, said control signal causing an output drive level of said output driver circuit to increase or decrease from a predesignated output drive level.

2. The adaptive driver circuit of claim 1, wherein said control circuit comprises a first voltage comparator having a first input terminal configured to receive said load voltage signal, a second input terminal configured to receive a first reference voltage signal from a reference voltage source, and a first comparator output terminal configured to provide an output signal upon said first voltage comparator comparing said load voltage signal with said first reference voltage signal.

3. The adaptive driver circuit of claim 2, wherein said control circuit further comprises a latch circuit having an input terminal configured to receive said output signal provided by said first voltage comparator, a latch output terminal configured to provide said control signal, and a strobe input terminal configured to receive a signal to activate said latch circuit for storing said output signal provided by said first voltage comparator.

4. The adaptive driver circuit of claim 3, wherein said charging circuit comprises:
    a current source configured to produce a predefined current; and
    a current mirror coupled to said current source configured to produce said reference current in response to said predefined current.

5. The adaptive driver circuit of claim 4, wherein said charging circuit further comprises an enabling transistor coupled to said current mirror for controlling said reference current.

6. The adaptive driver circuit of claim 2, wherein said charging circuit comprises:
    a current source configured to produce a predefined current;
    a current mirror coupled to said current source configured to produce an internal current in response to said predefined current;
    an internal capacitor coupled to said current mirror configured to receive said internal current, said capacitor developing an internal voltage signal thereacross in response to said received internal current;
    a second voltage comparator having a first input terminal configured to receive said internal voltage signal, a second input terminal configured to receive a second reference voltage signal from a reference voltage source, and an output terminal configured to produce a switch signal upon comparing said internal voltage signal with said second reference voltage signal; and
    a switch transistor having an input terminal configured to receive said switch signal and an output terminal coupled to said capacitive load configured to supply said reference current thereto in response to said switch signal.

7. The adaptive driver circuit of claim 6, wherein said first comparator output terminal is coupled to said second input terminal of said output driver circuit.

8. In an adaptive output driver circuit having an output terminal coupled to a capacitive load having an unknown capacitance value, a method for identifying an optimum output drive level for said output driver circuit the method comprising the steps of:
    measuring said capacitive load;
    generating, in response to said capacitive load measurement, a control signal; and
    adjusting, in response to said control signal, an output drive level of said output driver circuit to increase or decrease from a predesignated output drive level so that when said increased or decreased output drive level is applied to said capacitive load an output signal exhibiting a desired slew rate is obtained on said output terminal.

9. The method of claim 8, wherein said step of measuring said capacitive load comprises the steps of:
    supplying a reference current to said capacitive load to develop a load voltage signal across said capacitive load; and
    comparing said load voltage signal with a reference voltage signal.

10. The method of claim 8, wherein slew rates substantially equal to said desired slew rate is obtained for varying load capacitances.

11. In an adaptive driver circuit having an output driver circuit configured to drive a capacitive load having an unknown value, a charging circuit configured to supply a reference current, and a control circuit configured to control an output drive level of said output driver circuit, a method for varying the output drive level applied to said capacitive load, the method comprising the steps of:
    disabling said output driver circuit to prevent said output driver circuit from driving said capacitive load;
    charging said capacitive load with said reference current;

developing a load voltage signal across said capacitive load in response to said supplied reference current;

comparing said load voltage signal with a first reference voltage signal;

producing a control signal corresponding to said comparison between said load voltage signal and said first reference voltage signal;

providing said control signal to said output driver circuit, said control signal adjusting an output drive level of said output driver circuit to increase or decrease from a predesignated output drive level; and enabling said output driver circuit to allow said output driver circuit to drive said capacitive load with said adjusted output drive level.

12. The method of claim 11, wherein said step of charging said capacitive load comprises the steps of:

supplying a predefined current to a current mirror; and in response, supplying said reference current from said current mirror to said capacitive load.

13. The method of claim 12, wherein said step of producing a control signal comprises the steps of:

sampling, after a predefined duration, said comparison between said first reference voltage signal and said load voltage signal; and outputting said control signal in response to said sampling step.

14. The method of claim 11, wherein said step of charging said capacitive load comprises the steps of:

supplying a predefined current to a current mirror;

in response, outputting an internal current from said current mirror;

supplying said internal current to an internal capacitance;

in response, developing an internal voltage signal across said internal capacitance;

comparing said internal voltage signal to a second reference voltage signal;

in response, outputting a switch signal;

supplying said switch signal to a switch transistor; and in response, supplying said reference current from said current mirror to said capacitive load.

15. An adaptive driver circuit having a variable output drive level for producing an output signal having a desired slew rate, the adaptive driver circuit comprising:

capacitance sensing means for measuring a capacitive load coupled to said adaptive driver circuit, said capacitive load having an unknown capacitance value;

driver control means coupled to said capacitive sensing means for generating a control signal responsive to said measured capacitive load; and output drive means for driving said capacitive load, being coupled to said driver control means, wherein in response to said control signal an output drive level of said output drive means being increased or decreased from a predesignated output drive level so that said output signal exhibiting said desired slew rate is obtained across said capacitive load.

16. The adaptive driver circuit of claim 15, wherein said capacitive sensing means comprises:

reference current generation means for supplying a reference current to said capacitive load to develop a load voltage signal across said capacitive load;

reference voltage generation means for generating a reference voltage level; and voltage comparator means for comparing said reference voltage level with said load voltage signal.

17. An adaptive driver circuit having a variable output drive level for producing an output signal having a slew rate within a predefined range for varying capacitive loads, the adaptive driver circuit comprising:

a capacitance sensor configured to measure a capacitive load having an unknown capacitance value;

a control circuit coupled to said capacitance sensor, configured to generate a control signal responsive to said measured capacitive load; and an output driver coupled to said control circuit, configured to drive said capacitive load, wherein in response to said control signal an output drive level of said output driver being increased or decreased so that an output signal having a slew rate within said predefined range is obtained.

18. The adaptive driver circuit of claim 17, wherein said capacitance sensor comprises:

a reference current generator configured to supply a reference current to said capacitive load to develop a load voltage signal across said capacitive load; and a voltage sensor configured to measure said load voltage signal.

19. The adaptive driver circuit of claim 18, wherein said voltage sensor comprises:

a reference voltage generator for generating a reference voltage level; and a voltage comparator for comparing said reference voltage level with said load voltage signal.

20. The output circuit of claim 1, wherein said output driver circuit is disabled during said charging circuit supplying said reference current to said output terminal, and said charging circuit is disabled during said output driver circuit driving said capacitive load.

21. The output circuit of claim 16, wherein said output drive means is disabled when said capacitance sensing means is operating to supply said reference current to said capacitive load, and said capacitance sensing means is disabled during normal operation when said output drive means drives said capacitive load.

22. An output circuit, comprising:

an output driver having a first input terminal for receiving an input signal, a second input terminal for receiving a control signal, and an output terminal coupled to a capacitive output load having an unknown capacitance value, said output driver driving said capacitive output load in response to said input signal when enabled;

a current supply circuit coupled to said capacitive load configured to supply a reference current to said capacitive load to develop a load voltage signal across said capacitive load when enabled; and a control circuit having a first input terminal configured to receive said load voltage signal, a second input terminal configured to receive a reference voltage signal from a reference voltage generator, and an output terminal coupled to said second input terminal of said output driver, said control circuit further comprising a voltage comparator configured to compare said load voltage signal with said reference voltage signal, wherein said output driver is disabled when said current supply circuit supplies said reference current to said capacitive load, said control circuit providing said control signal on said second input terminal of said output driver responsive to said voltage comparator comparing said load voltage signal with said reference voltage signal, said control signal causing an output drive level of said output driver to increase or decrease so that when said output driver is enabled to drive said capacitive output load an output signal having a desired slew rate is obtained across said capacitive output load.

23. The output circuit of claim 22, wherein said current supply circuit and said control circuit are disabled during normal operation when said output driver circuit is operating to drive said capacitive output load.

* * * * *